United States Patent [19]

Meredith

[11] Patent Number: 5,790,517
[45] Date of Patent: Aug. 4, 1998

[54] POWER SHARING SYSTEM FOR HIGH POWER RF AMPLIFIERS

[75] Inventor: Sheldon Kent Meredith, Phoenix, Ariz.

[73] Assignee: Radio Frequency Systems, Inc., Marlboro, N.J.

[21] Appl. No.: 683,735

[22] Filed: Jul. 26, 1996

Related U.S. Application Data

[63] Continuation of Ser. No. 314,898, Sep. 29, 1994, abandoned.

[51] Int. Cl.$^6$ .................................................. G08G 15/00
[52] U.S. Cl. .................... 370/210; 330/126; 364/726.01; 455/103
[58] Field of Search .................. 370/33, 34, 23, 370/27, 60, 37, 38, 210, 211, 274, 275, 276, 297; 342/152, 174, 25, 132, 191, 379; 364/725, 726, 516, 517, 726.01, 726.12, 726.03; 358/432; 348/403; 330/45, 276, 280, 124, 51, 286; 379/60; 455/103, 9, 10, 13.1, 13.2, 13.3, 13.4, 22, 38.3, 33.1, 33.2, 33.3, 52.3; 333/127, 125, 119, 128, 132, 109

[56] References Cited

U.S. PATENT DOCUMENTS

| | | | |
|---|---|---|---|
| 3,710,281 | 1/1973 | Thomas | 333/6 |
| 3,731,217 | 5/1973 | Gerst et al. | 330/56 |
| 3,783,385 | 1/1974 | Dunn et al. | 375/329 |
| 3,964,065 | 6/1976 | Roberts et al. | 342/380 |
| 4,091,387 | 5/1978 | Profera | 343/754 |
| 4,163,974 | 8/1979 | Profera | 343/16 |
| 4,375,650 | 3/1983 | Tiemann | 364/725 |
| 4,603,408 | 7/1986 | Singhal et al. | 367/92 |
| 4,647,868 | 3/1987 | Mueller | 330/286 |
| 4,774,481 | 9/1988 | Edwards et al. | 333/127 |
| 4,785,267 | 11/1988 | Covill | 333/125 |
| 4,814,730 | 3/1989 | Via et al. | 333/119 |
| 4,835,496 | 5/1989 | Schellenberg et al. | 333/128 |
| 4,932,049 | 6/1990 | Lee | 379/60 |
| 5,032,804 | 7/1991 | Hollingsworth | 333/132 |
| 5,067,147 | 11/1991 | Lee | 379/60 |
| 5,070,304 | 12/1991 | Salib et al. | 330/54 |
| 5,091,875 | 2/1992 | Wong et al. | 364/726 |
| 5,111,166 | 5/1992 | Plonka et al. | 333/128 |
| 5,162,804 | 11/1992 | Uyeda | 342/373 |
| 5,168,375 | 12/1992 | Reisch et al. | 358/432 |
| 5,187,447 | 2/1993 | Tsai | 330/124 |
| 5,193,109 | 3/1993 | Lee | 379/60 |
| 5,214,394 | 5/1993 | Wong | 330/286 |
| 5,222,246 | 6/1993 | Wolkstein | 455/13.4 |
| 5,239,667 | 8/1993 | Kanai | 455/10 |
| 5,245,347 | 9/1993 | Bonta et al. | 342/149 |
| 5,302,914 | 4/1994 | Arntz et al. | 330/129 |
| 5,304,943 | 4/1994 | Koontz | 330/51 |
| 5,313,174 | 5/1994 | Edwards | 333/109 |
| 5,394,349 | 2/1995 | Eddy | 364/725 |

FOREIGN PATENT DOCUMENTS 0593822  4/1994  European Pat. Off. .

*Primary Examiner*—Dang Ton
*Attorney, Agent, or Firm*—Ware, Fressola, Van Der Sluys & Adolphson LLP

[57] ABSTRACT

A land mobile radio system (110) includes a plurality of radio channels (112), each radio channel (112) being interconnectable (115) to any one of a number, N, of combiners (114), and each combiner (114) being associated with a corresponding transmit antenna (120). A combiner output signal at the output of each combiner (114) is connected to a transform matrix (133) which divides each combiner output signal into a number, N, of transformed signals, each transformed signal containing an equal power level part, 1/N, of each combiner output signal. Each transformed signal is provided to an amplifier (135) for amplification thereof, and the amplified transformed signals are provided to an inverse-transform matrix (138) which recombines the equal parts of each amplified transformed signal into amplified combiner output signals which are provided to the antennas (120) for transmission thereof. The land mobile radio system (110) includes N antennas (120), and where N is a power of m, e.g., $N=m^r$ then the transform matrix (133) is a Fourier transform matrix using a radix-m decimation-in-frequency algorithm having r stages, and the inverse-transform matrix (138) is an inverse-Fourier transform matrix using a radix-m decimation-in-time algorithm having r stages.

31 Claims, 6 Drawing Sheets

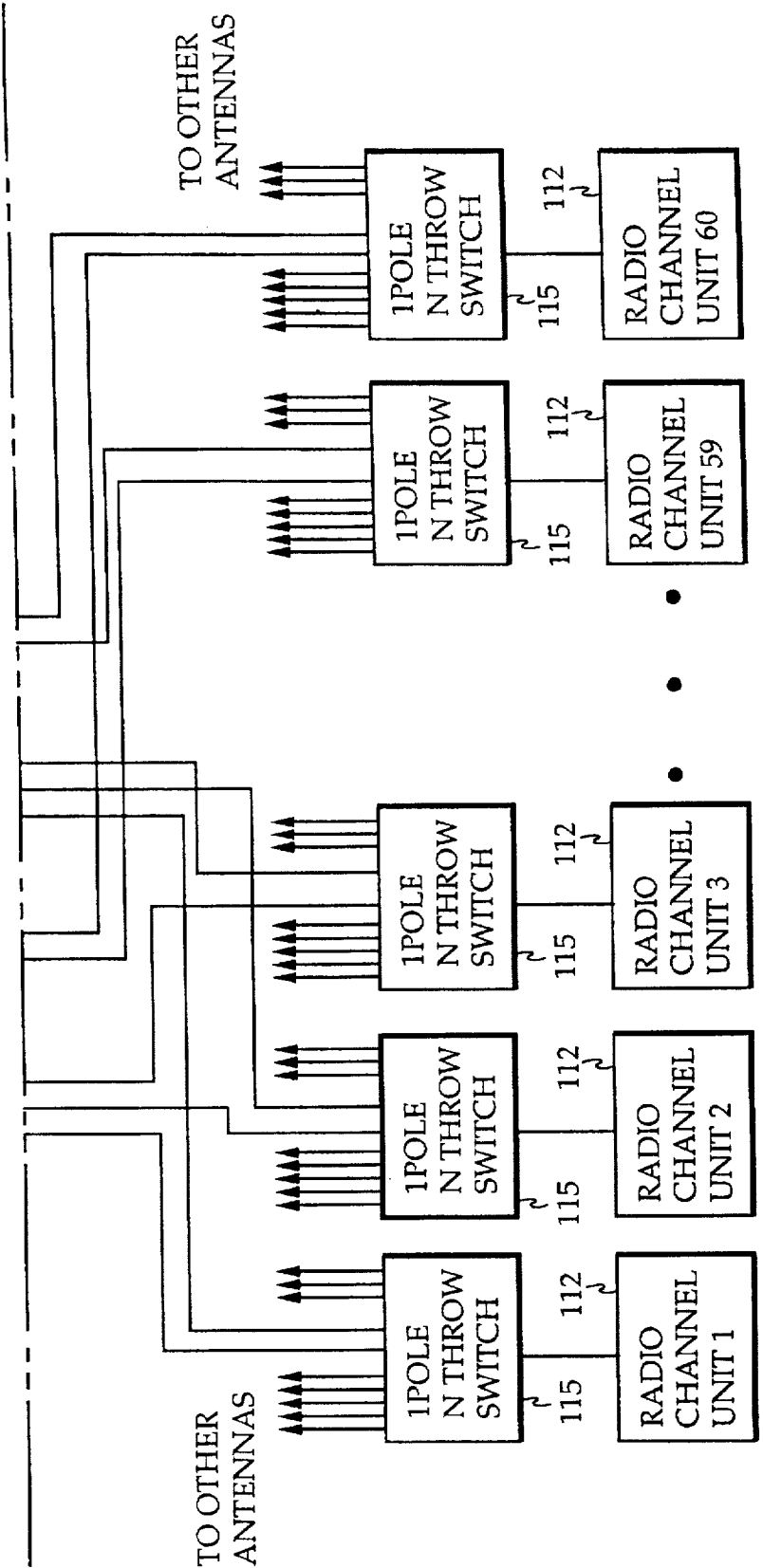
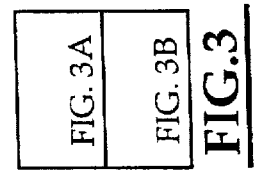
FIG.3B
FIG.3
| FIG.3A |
| FIG.3B |

POWER SHARING SYSTEM FOR HIGH POWER RF AMPLIFIERS

This application is a continuation of application Ser. No. 08/314,898, filed on Sep. 29, 1994, now abandoned.

TECHNICAL FIELD

The present invention relates to power sharing systems for radio frequency (RF) amplifiers.

BACKGROUND OF THE INVENTION

Land mobile radio systems must generate power at radio frequencies (RF) in order to communicate with remote mobile stations. For many years, such communications were accomplished using a system 10 such as the one shown in FIG. 1. Referring to FIG. 1, such prior art systems use independent amplifiers 13 to amplify RF signals provided by radio channel units 12 (each for communication with a corresponding mobile station) and then combine the amplified radio signals with high-Q tuned combiners 15 (cavity combiners). The combined signals are then presented to a bandpass transmit filter 19 having an output connected to a transmit antenna 20 for transmission to the remote mobile stations (not shown).

A problem associated with the use of static cavity combiners is that such combiners cannot function over a wide frequency range and therefore do not have the desired frequency-agile characteristics that are required with current mobile communication systems. Referring to FIG. 2, to overcome the limitations of the system of FIG. 1 using cavity combiners, a new technique is employed by current systems 25 wherein radio signals are combined through lossy combiners 30 that can combine signals over a wide frequency range, e.g., 869 to 894 MHz. The outputs of these combiners are amplified with linear amplifiers 35. By using linear amplifiers 35 which are broadband in frequency range, the system 25 is capable of handling input signals which are highly frequency-agile.

It is important that the amplifiers used in the system of FIG. 2 have very linear amplification characteristics. If the amplifiers are not highly linear, additional undesired intermodulation signals will be present at the amplifier's output, thereby degrading communication quality.

It is will known to describe the linearity of an amplifier by its "output third order intercept point (IP30)". For a given set of amplification conditions, the IP30 requirement for an amplifier is given by equation 1 below:

$$IP30 = 15 \log P_0 - IM/2 + 5\log(N^2 - 3N/2) \quad \text{(eq. 1)}$$

were: $P_0$=power output per radio channel in milliwatts; N=number of radio channels being amplified; and IM=maximum allowable intermodulation level (intermodulation distortion) in dBm. For amplifiers which must produce a power output on the order of a few milliwatts, e.g., 10 milliwatts, for a small number of radio channels, e.g., 4 channels, and with relatively low intermodulation levels, e.g., −13 dBm, a fairly small and relatively inexpensive amplifier may be used. However, when the need to generate power levels an order of magnitude higher, e.g., 5 watts per channel, for a large number of channels, e.g., 20 channels, while maintaining a similar intermodulation level, the size and cost of the amplifier required significantly increases.

In a typical land mobile radio system, there may be as many as 60 channels connected to 12 antennas, with each antenna having on average 5 radios connected thereto via a lossy combiner and a linear power amplifier. As described above, each of these amplifiers can be quite expensive if they must produce several watts for each of the channels while maintaining low intermodulation distortion. Another problem in determining the size of an amplifier in such a land mobile radio system relates to the statistical determination of how many radios (users) will be connected simultaneously to any one antenna. On average, there might only be 5 users, but it is very possible that 8 or 10 users may demand service through a single amplifier at a particular instance in time. In this case, the linearity requirements of the amplifier increase by $5\log(N^2-3N/2)$. For example, when increasing the number of users from 5 to 10, the IP30 intercept point increases by over 3 dB as given by the examples below:

$$5 \log(5^2 - 3*5/2) = 6.22 \ dBm$$

$$5\log(10^2 - 3*10/2) = 9.65 \ dBm$$

An amplifier designed to handle such a large power while maintaining low intermodulation distortion is physically large, consumes massive amounts of power, is prone to frequent failure, and is extremely expensive.

One method of dealing with this problem is to use very large linear power amplifiers and discretely assign a small number of channels to each amplifier. For example, a land mobile radio system, e.g., a cellular base site, may be fitted with 6 linear amplifiers. Each amplifier is physically large, approximately 2'×2'×3' (0.6 m×0.6 m×0.9 m), and extremely expensive. For a 60 channel site, each amplifier must amplify 10 radio channels, e.g., 10 base site radio signals, and has a quiescent d.c. power drain of approximately 1500 watts. It is evident that both the initial hardware cost and the operational cost associated with power consumption are very large. Additionally, since the radio outputs are statistically assigned to specific amplifiers, such a system does not have the inherent ability to dynamically connect any radio channel to any antenna.

The present invention provides a solution to these problems by a power sharing system that departs from these traditional approaches by eliminating the problems associated with statistical channel loading.

DISCLOSURE OF THE INVENTION

An object of the present invention is to provide an amplifier power sharing system for a first plurality of channels for transmission on a second plurality of antennas in any order, thereby eliminating the need of any amplifier being required to amplify a variable number of channels.

A further object of the present invention is to provide a power sharing system which eliminates statistical peaking of the number of radio channels connected to any one amplifier associated with a transmit antenna.

Another object of the present invention is to provide such a power sharing system for use in a land mobile radio system.

A further object of the present invention is to provide a land mobile radio system having reduced hardware cost, improved reliability, improved signal transmission quality due to improved amplifier characteristics, and dynamic connection of any user channel to any transmit antenna to thereby provide improved signal transmission quality by using the transmit antenna best suited to transmit the corresponding signal.

A still further object of the present invention is to provide an amplifier power sharing system for evenly distributing a plurality of input signals over the amplifiers of the system, and for thereafter recovering the amplified input signals.

According to the present invention, a plurality of input signals are provided to a transform matrix which divides each input signal into a number, N, of transformed signals, each transformed signal containing an equal part, 1/N, of the power of each input signal; each transformed signal is provided to an amplifier for amplification thereof; and the amplified transformed signals are provided to an inverse-transform matrix which recombines the parts of each amplified transformed signal into amplified input signals.

In further accord with the present invention, the amplified input signals are amplified replicas of the input signals.

According further to the present invention, in a land mobile radio system having a plurality of radio channels, each radio channel being interconnectable to any one of a number, N, of combiners, each combiner being associated with a corresponding transmit antenna, the input signals are provided by the outputs of the combiners, and the transmit antennas transmit the amplified input signals.

In further accord with the present invention, any radio channel may be dynamically connected to any one of the combiners.

In still further accord with the present invention, the transform matrix is a Fourier transform matrix and the inverse-transform matrix is an inverse-Fourier transform matrix.

According still further to the present invention, the land mobile radio system includes N antennas, and where N is a power of m, e.g., $N=m^r$, then the transform matrix is a Fourier transform matrix using a radix-m decimation-in-frequency algorithm having r stages, and the inverse-transform matrix in an inverse-Fourier transform matrix using a radix-m decimation-in-time algorithm having r stages.

The present invention provides a significant improvement over the prior art because a land mobile radio system may be provided with linear amplifiers wherein no statistical peaking allowance is required. Using the system of the present invention, each amplifier is equally used by all user channels so that even if all channels are simultaneously active, the maximum power ever required by any one amplifier is 1/N of the total power for all channels, where N is equal to the number of amplifiers. Additionally, using the system of the present invention, a radio channel is not required to be discretely assigned to a particular amplifier and antenna, but rather, the system allows the dynamic switching of any user channel to any one of the antennas without affecting the power requirement of the associated amplifier. Therefore, the present invention provides an improved land mobile radio system having reduced equipment cost, reduced operating cost and improved reliability and signal transmission quality.

The foregoing and other objects, features and advantages of the present invention will become more apparent in light of the following detailed description of exemplary embodiments thereof as illustrated in the accompanying drawings.

BRIEF DESCRIPTION OF THE DRAWINGS

FIG. 3 shows the relation between FIGS. 3A and 3B.

FIGS. 3A–3B are together a schematic block diagram of a land mobile radio system having power sharing in accordance with the present invention;

BEST MODE FOR CARRYING OUT THE INVENTION

The power sharing system of the present invention is particularly well suited for use in a land mobile radio system wherein the statistical peaking of the number of channels (users) connected to any amplifier associated with an antenna of the system is eliminated because of the equal distribution of input channel power loads across each of the system amplifiers. Therefore, the required size of each system amplifier is minimized, but fully and uniformly utilized, thereby reducing hardware costs and improving reliability. Additionally, the system of the present invention allows the dynamic connection of any radio channel of the system to any one of the system antennas.

Figure 3A:
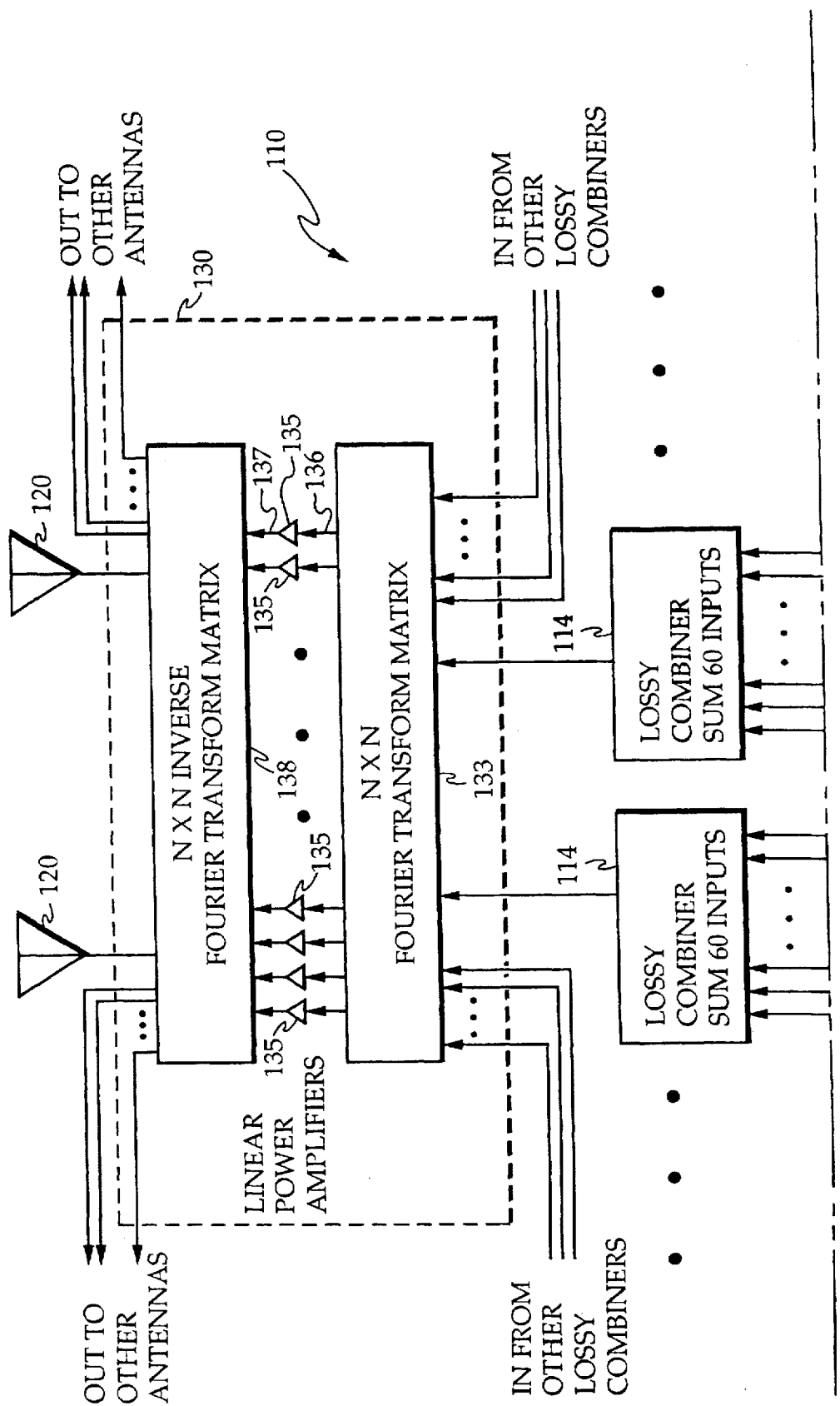

Referring to FIGS. 3A–3B, a land mobile radio system 110 includes a plurality of radio channel units 112. In the example of the present invention, the system 110 includes 60 radio channel units. Each of the radio channel units 112 may be connected to any one of a plurality of lossy combiners 114 by a one-pole-N-throw switch 115. For purposes of illustrating the present invention, there are 16 lossy combiners 114, each being connected to any one of the radio channel units 112 by a one-pole-16-throw switch 115. It will therefore be understood by those skilled in the art that each lossy combiner 114 has up to 60 inputs which may be connected at any one time by the 60 one-pole-16-throw switches 115 to the 60 radio channeled units 112. Each of the radio channel units 112 is associated with a mobile station (not shown), e.g., a cellular telephone subscriber or user, and each channel is assigned a unique operating frequency.

When a receiver section (not shown) of the land mobile radio system 110 receives communication signals associated with the various radio channels 112, the communication signals are uniquely identified to one of the radio channel units 112 and provided thereto by the system 110. Thereafter, the radio channel unit 112 performs appropriate signal processing, e.g., signal filtering and amplification, and provides the signals via the system described hereinafter for transmission to the associated subscriber.

Each one of the lossy combiners 114 is associated with a corresponding antenna 120 for transmitting signals to the subscribers of the system 110. The outputs of the combiners 114 are provided to the corresponding antennas 120 via the power sharing system 130 of the present invention.

The power sharing system 130 includes an N×N Fourier transform matrix (Fast-Fourier transform matrix) 133 which receives the outputs of the combiners 114, and provides transformed output signals to each of a plurality of linear power amplifiers 135. The outputs of the linear power amplifiers 135 are provided to an N×N inverse-Fourier transform matrix (inverse-Fast-Fourier transform matrix) 138. In the example of the present invention, there are sixteen (16) lossy combiners 114 and sixteen (16) antennas 120, and therefore there are sixteen (16) corresponding linear power amplifiers 135. Both the Fourier transform matrix 133 and the inverse-Fourier transform matrix 138 are 16×16 matrices.

Figure 4:
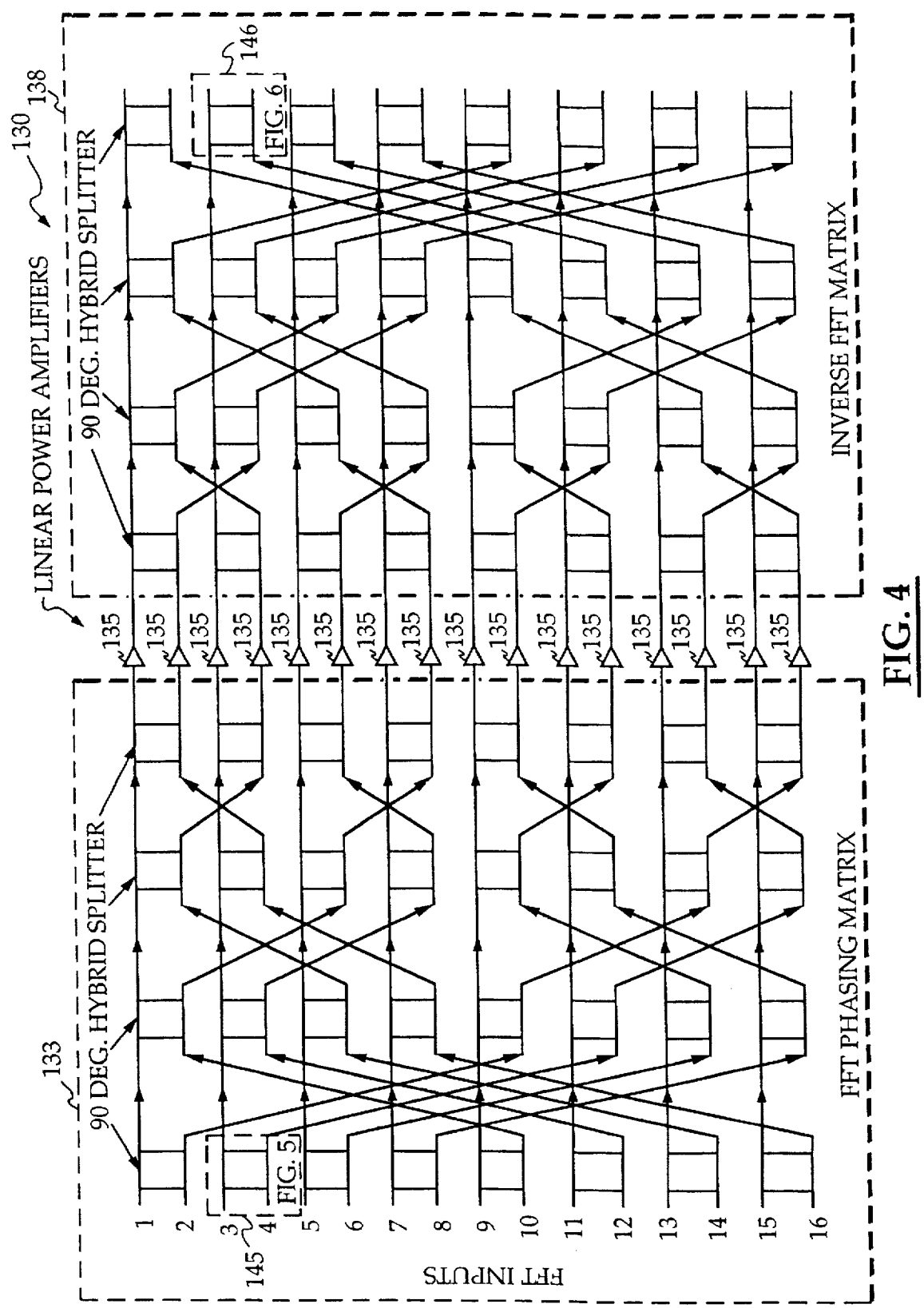
FIG. 4 is a diagram showing the operation of a Fourier transform matrix and an inverse-Fourier transform matrix in relation to 16 linear power amplifiers of the system of FIGS. 3A and 3B, the Fourier transform matrix using a radix-2 decimation-in-frequency algorithm having four stages and the inverse-Fourier transform matrix using a radix-2 decimation-in-time algorithm having four stages.

Referring also to FIG. 4, the power sharing system 130 is shown in greater detail. The Fourier transform matrix 133 evenly spreads the outputs of the 16 lossy combiners over the 16 linear power amplifiers 135. This is accomplished by using a radix-2 decimation-infrequency algorithm having four stages. A radix-2 decimation-in-frequency algorithm is described in greater detail on pages 28 through 30 and FIGS. 8 through 14 of Kraniauskas, Peter, "A Plain Man's Guide to the FFT", IEEE Signal Processing Magazine, Pages 24–35, April 1994, the disclosure of which is incorporated herein by reference. As will be understood by those skilled in the art, each stage of a radix-2 decimation-in-frequency algorithm includes a plurality of ninety degree hybrid splitters 145, which are shown in greater detail in FIG. 5.

Figure 5:
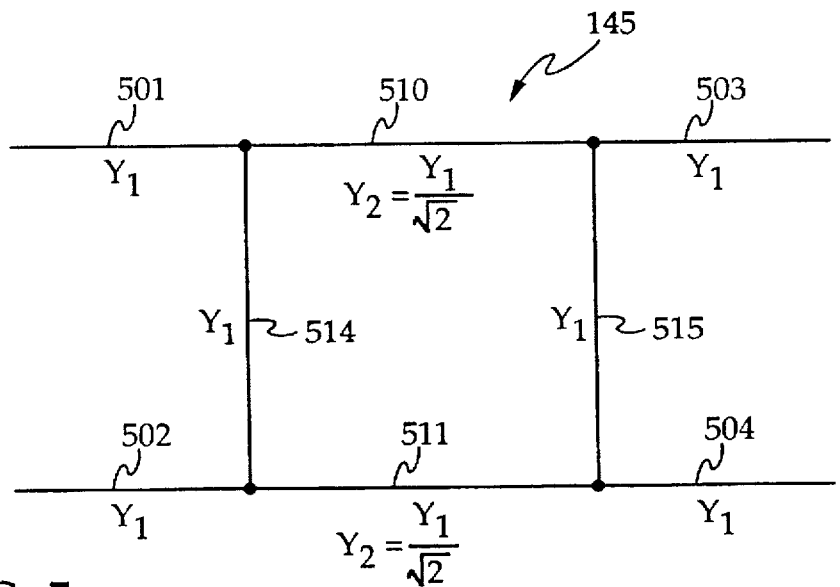
FIG. 5 is a diagram of a ninety degree hybrid splitter used in the Fourier transform matrix and inverse-Fourier transform matrix of FIG. 4.

Referring to FIG. 5, each ninety degree hybrid splitter 145 may be a symmetrical four-port branch line coupler of the type known in the art. In the first stage of the Fourier transform matrix, outputs from two of the 16 lossy combiners are coupled to the splitter by a pair of input ports (lines) 501,502 having an identical characteristic impedance, $Y_1$, e.g., 50Ω. The outputs from the splitter are provided on a pair of output ports (lines) 503,504. The output ports 503, 504 have the same characteristic impedance, $Y_1$, as the input ports 501,502. The input ports 501,502 are connected to the output ports 503,504 by a pair of primary lines 510,511. Additionally, the input ports 501,502 and the output ports 503,504 are shunt connected by a pair of secondary lines (branch lines) 514,515. The length and impedance of the primary lines 510,511 and secondary lines 514,515 is selected to provide the desired division ratio of the input signals to the output signals.

To implement the desired ninety degree hybrid splitter of the present invention, the characteristic impedance, $Y_2$, of the primary lines 510,511 is selected to be equal to the characteristic impedance of the input and output ports times $2^{-\frac{1}{2}}$, i.e., $Y_2=(Y_1)(2^{-\frac{1}{2}})=0.707Y_1$. The characteristic impedance of the secondary lines is the same as the characteristic impedance of the input and output ports, i.e., $Y_1$. The length of the primary lines and secondary lines is selected to be one-quarter (¼) wavelength of the input signals. The phase velocity of the signals in the primary lines and secondary lines will be different because of the different characteristic impedance of the lines, and therefore, lines of different lengths must be used to provide the one-quarter wavelength length.

Figure 6:
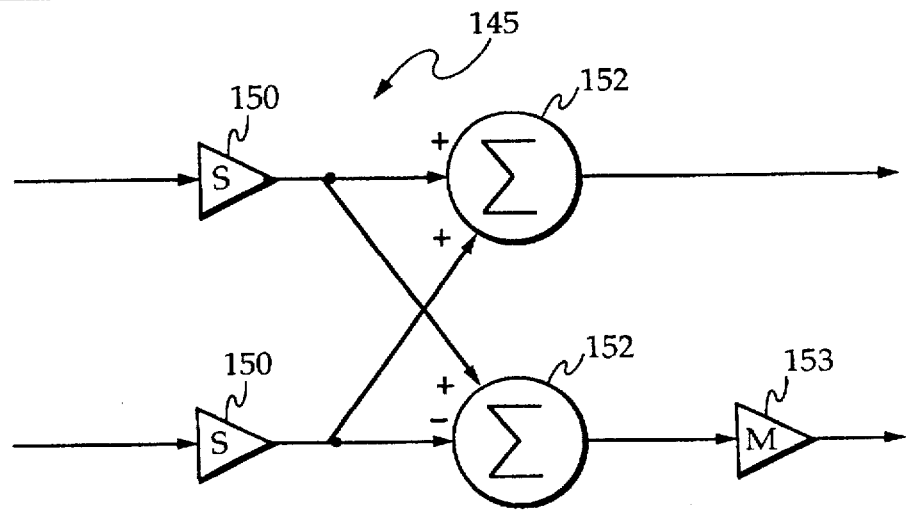
FIG. 6 is a diagram showing an alternative embodiment of a ninety degree hybrid splitter of the Fourier transform matrix of FIG. 4.

The hybrid splitter 145 may also be implemented using a "decimation-in-frequency butterfly" as illustrated in FIG. 6. Referring to FIG. 6, a decimation-in-frequency butterfly includes scaling functions 150, algebraic functions 152 and multipliers 153 known as "twiddle factors". The scaling factors 150 are not required at every decimation stage, and can be collected to be applied only once, either to the input sequence or the output sequence of the Fourier transform matrix 133. As is known in the art, each of the splitters 145 shifts its input by ½ of its period, in this case ninety degrees. The output of a decimation stage can be interpreted as two half-length sequences of the input of the stage. Therefore, by recursively applying the decimation process over four stages, each one of the 16 lossy combiner output signals is spread out evenly over the 16 matrix outputs, e.g., $2^4=16$, so that each amplifier amplifies one-sixteenth of each channel.

As shown in both FIGS. 3 and 4, the outputs of the Fourier transform matrix 133 are provided as the inputs to each power amplifier 135. In this case, using the Fourier transform matrix described hereinabove, each amplifier is used by all 60 input channels at a low power per channel. Therefore, even if all channels are active simultaneously, the maximum power ever required by any one amplifier is just 1/N(1/16th) of the total power for all 60 channels. This gives an effective peak power requirement for each amplifier equal to that for less than 4 (60÷16=3.75) radio channels instead of the 8 to 10 radio channel statistical peak power requirement that must be designed into a prior art system having 60 channels. Therefore, no statistical peaking allowance is required with the amplification system of the present invention. Additionally, in prior art systems, if one of the amplifiers fails, no amplified signals are provided to the corresponding antenna for transmission. In contrast, using the power sharing system of the present invention, if one of the amplifiers fails, amplified signals are provided to all of the antennas from the remaining operating amplifiers.

It will also be understood by those skilled in the art that using the power sharing system of the present invention, there is no need to discretely assign any one channel to a corresponding antenna and amplifier. Instead, the one-pole-16-throw switches may be used to direct the output of the corresponding radio channel unit to the antenna best suited to transmit the signal. This is apparent by the realization that all amplifiers of the system equally amplify the outputs of every radio channel unit.

Figure 7:
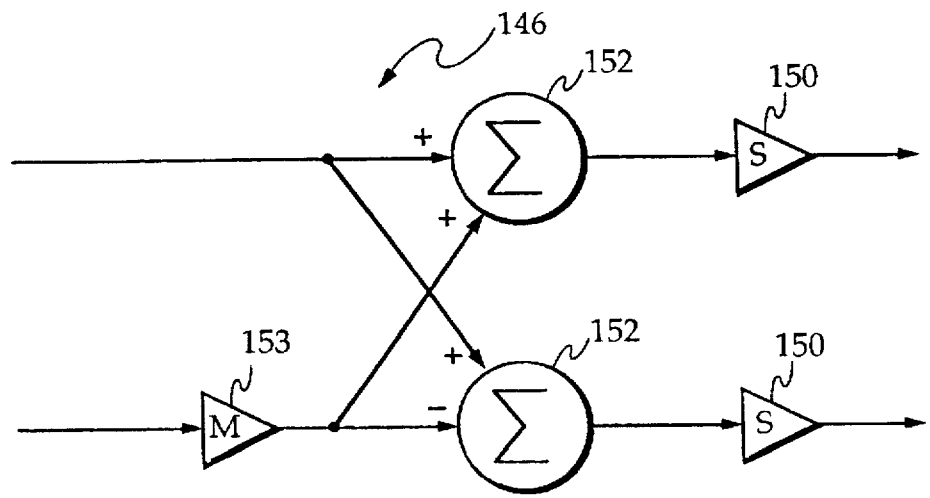
FIG. 7 is a diagram showing an alternative embodiment of a ninety degree hybrid splitter of the inverse-Fourier transform matrix of FIG. 4.

After amplification of the distributed lossy combiner signals, the original lossy combiner signals are reconstructed by the inverse-Fourier transform matrix 138. The inverse-Fourier transform matrix utilizes a radix-2 decimation-in-time algorithm having four stages to convert the outputs of the 16 amplifiers into amplified replicas of the outputs of the 16 lossy combiners. The operation of the radix-2 decimation-in-time algorithm is described on pages 31 through 32 and FIGS. 15 through 19 of the above referenced Kraniauskas article, the disclosure of which is incorporate herein by reference. A ninety degree hybrid splitter 146, of the type shown in FIG. 5 and described hereinabove, is used in the radix-2 decimation-in-time algorithm. Alternatively, a "decimation-in-time butterfly" of the type shown in FIG. 7 may be used to implement the inverse-Fourier transform matrix. The decimation-in-time butterfly 146 is basically the inverse of the decimation-in-frequency butterfly 145 (FIG. 6). Each stage combines corresponding half-length sequences, starting with the final decimation stage, and back-propagates the arguments towards the input stage. As mentioned above, the final outputs are amplified replicas of the lossy combiner output signals. Thereafter, the outputs of the inverse-Fourier transform matrix are provided to the various corresponding antennas 20 (FIGS. 3A and 3B) for transmission to the corresponding mobile subscribers.

As discussed herein above, each splitter 145 in the Fourier transform matrix introduces a ninety degree phase shift to the input of the splitter for producing two half-length sequences of the splitter input. Similarly, in the inverse-Fourier transform matrix, each splitter combines two half-length sequences into an original parent sequence. If, either during amplification of the outputs of the Fourier transform matrix or during transmission of the input and output of the amplifiers 135 on signal lines 136 and 137, different phase shifts are introduced into the signals, the signals may be improperly reconstructed in the inverse-Fourier transform matrix. Therefore, it is important that the signal lines 136, 137 and amplifiers 135 be phase-balanced with respect to one another so that each signal experiences an identical phase shift during amplification and transmission between the Fourier transform matrix and inverse-Fourier transform matrix. The phase-balancing may be accomplished by controlling the lengths of the signal lines 136, 137, and/or by adjusting the phase shift introduced by the amplifiers 135.

Figure 1:
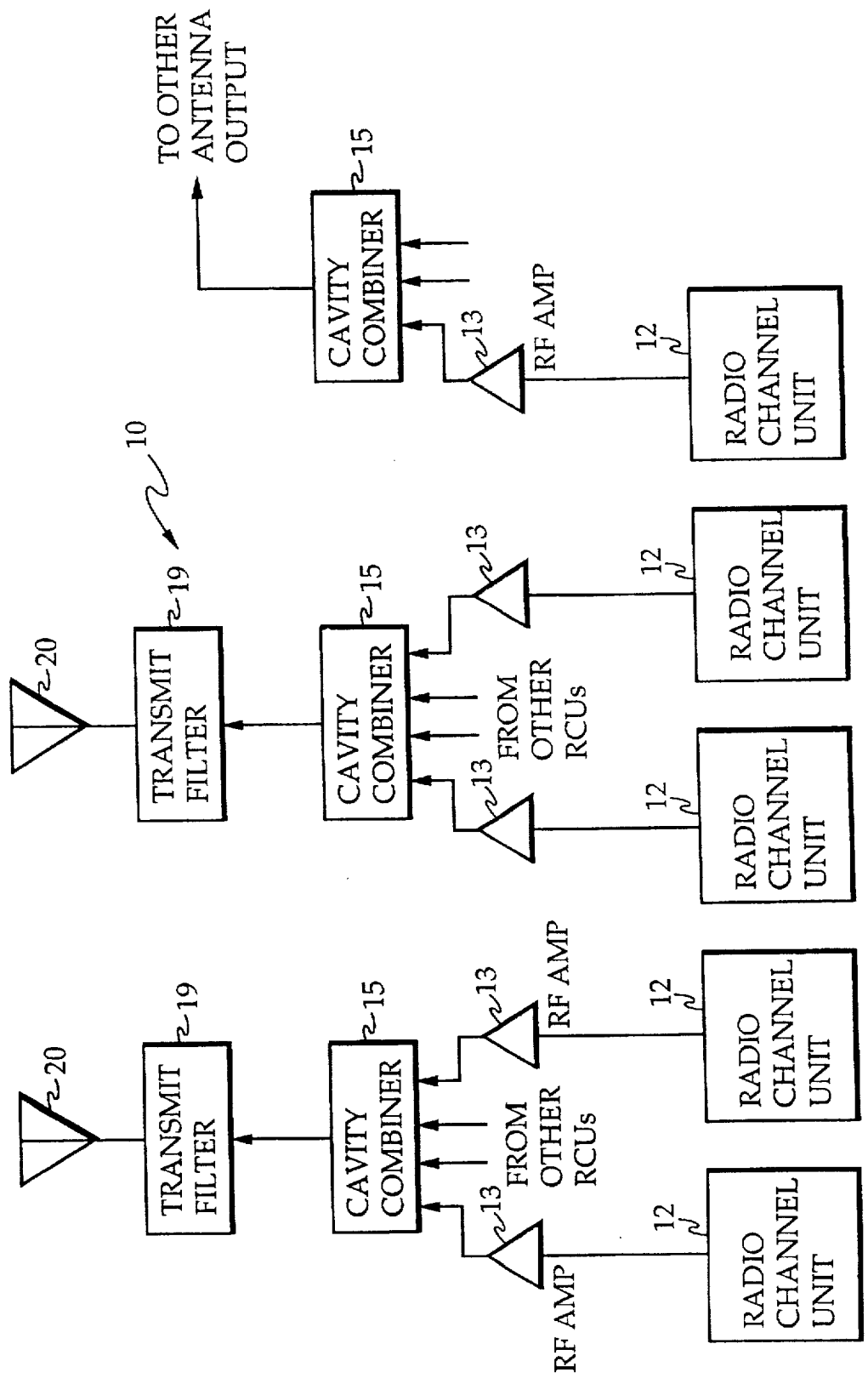
FIG. 1 is a schematic block diagram of a prior art land mobile radio system.
Figure 2:
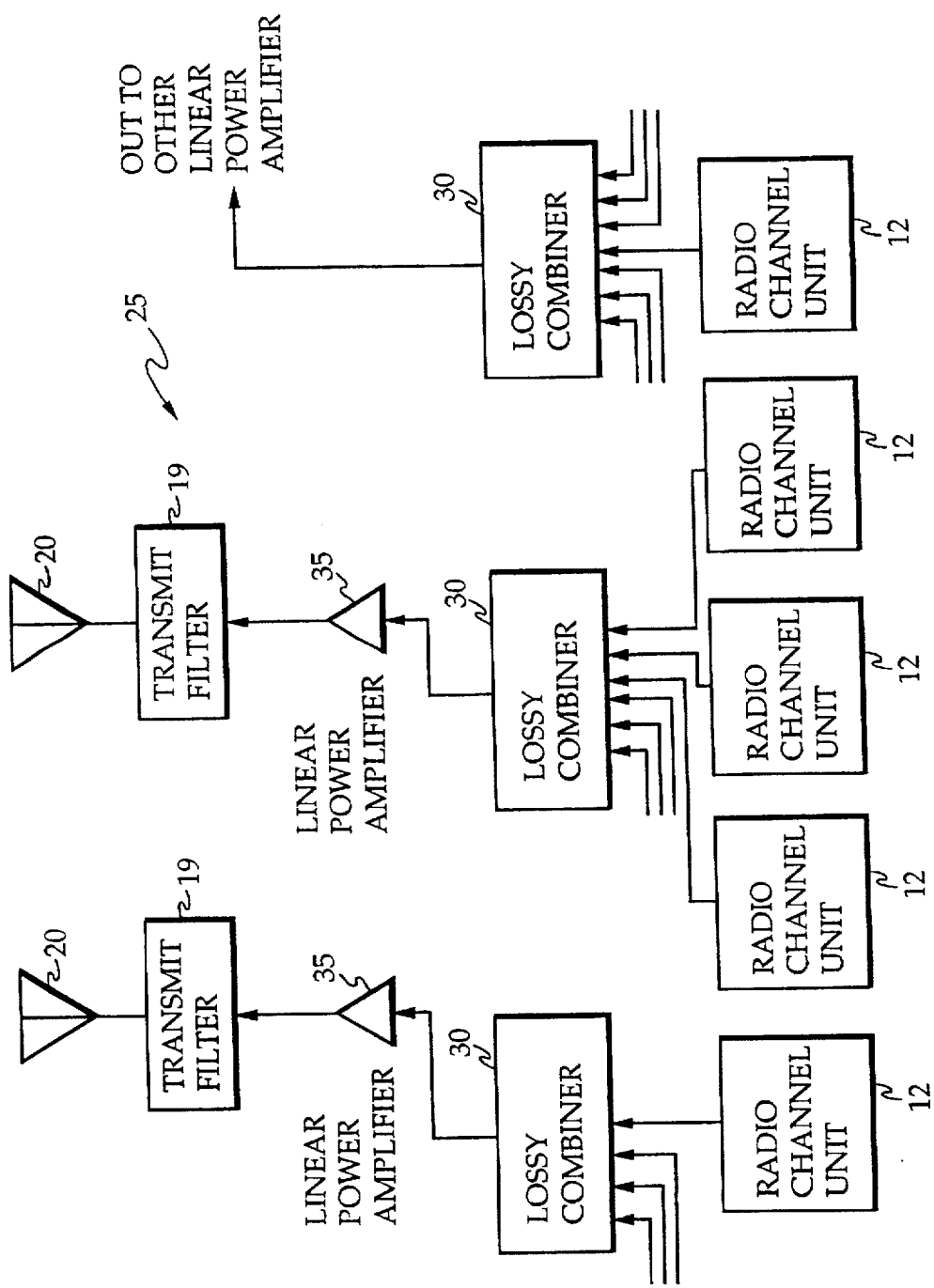
FIG. 2 is a schematic block diagram of a alternative embodiment of the prior art land mobile radio system.

The significant advantages of the present invention over the prior art are best understood by example. In the following example, both the prior art system of FIG. 2 and the system of the present invention will be compared having an identical number of channels, amplifiers, antennas, and intermodulation requirements. For purposes of the present example, assume that the land mobile radio system includes 60 channels, 16 antennas, and 16 amplifiers. Without the phasing network of the present invention, each of the 16 antennas needs to be able to handle the average load (approximately 4 channels) plus a statistical peaking amount (approximately an additional 4 channels). Therefore, it is possible that each amplifier must amplify 8 channels simultaneously. Alternatively, when the phasing network of the present invention is used, each of the 60 channels has its power divided by 16, and delivered to the 16 amplifiers. Therefore, instead of each amplifier being used by as many as 8 channels, each amplifier is used by all 60 channels on a low power per channel basis. Even if all 60 channels are active simultaneously, the maximum power ever required by any one amplifier is just 1/16th of the total power for all 60 channels. This gives an effective peak power requirement equal to that for approximately 4 (60/16=3.75) radio channels instead of 8 radio channels. No peaking allowance is required. Equation 1 is used to compare the IP30 requirement for the two systems.

Case 1: No power sharing system (prior art).

Power per channel required at amplifier output=10 watts.

Number of channels per amplifier=8 peak.

IM specification=−13 dBm.

IP30=15 log10,000−(−13/2)+5 log(64−12)

IP30=60+6.5+8.58=75.08 dBm

This is a large amplifier with very high operating costs. The −13 dBm IM specification used in the example is the level mandated by the FCC for amplifier intermodulation distortion levels.

Case 2: Using the power sharing system of the present invention.

Power per channel required at amplifier output=10/16 watt=625 mW.

Number of channels per amplifier=60

IM specification=−13 dBm

IP30=15 log625−(−13/2)+5 log(3600−90)

IP30=41.94+6.5+17.73=66.17 dBm

In this case, there are more users (channels) per amplifier, and therefore more chance of intermodulation distortion; however, the power per channel is divided by the number of amplifiers over which the signals are spread out. Therefore, the power per channel on each amplifier, i.e. 625 milliwatts, is much lower than the 10 watts associated with the prior art system. As can be seen from the above comparison, the amplifiers required with the present invention have an IP30 intercept point which is approximately 9 dB lower than the amplifiers required in the prior art. This represents a cost reduction of approximately 80% associated with the purchase of the amplifiers. Additionally, such amplifiers operate at a significantly reduced power level, and have an associated decrease in power consumption during operation.

It should be noted that in prior art case 1, the number of channels per amplifier is assumed to have a statistical peak of 8. In reality, there could be times when the actual number of channels exceed 8. If for instance and amplifier having an IP30 design of 75.08 dBm has 9 channels input at the same time instant, the required FCC intermodulation separation between channels would not be met.

In the above scenario, the intermodulation separation would be:

$$IM=30 \ log P_0 +10 \ log(N^2-3N/2)-2IP30 \qquad (\text{eq. 2})$$

$$IM=30 \ log10,000+10 \ log(81-13.5)-150.16$$

$$IM=120+18.29-150.16=-11.87 \ dBm$$

The intermodulation separation is therefor out of FCC specification since it is less than the −13 dBm required.

Although the preferred embodiment of the present invention is illustrated with a radix-2 Fast-Fourier Transform (FFT) having four stages, it will be understood by those skilled in the art that a variety of radices may be used in the Fourier transform matrix 133 (FIGS. 3A and 3B) and in the inverse-Fourier transform matrix 138 (FIG. 4) for implementing the present invention. For a given number of antennas and associated amplifiers, N, where N is a power of m, i.e., $N=m^r$, then the Fourier transform matrix uses a radix-m decimation-in-frequency algorithm having r stages and the inverse-Fourier transform matrix uses a radix-m decimation-in-time algorithm having r stages. In the example given above, N is 16 and m is 2, and therefore there are four stages, i.e., r=4. However, if a radix-4 decimation-in-frequency algorithm is used, only two stages are required. As will be understood by those skilled in the art, depending on the number of amplifiers used in the system, other radices and associated number of stages may be selected to meet the requirements of the implementation. Examples of radix-3 and radix-4 radices are provided on pages 32–35 of the above referenced *Kraniauskas* article, the disclosure of which is incorporated herein by reference.

The power sharing system is described herein as being used in a land mobile radio system. However, the principles of the present invention may be applied to any system where the number of channels to be amplified and presented at a given output (antenna for instance) can dynamically change.

Although the invention has been described and illustrated with respect to exemplary embodiments thereof, it should be understood by those skilled in the art that the foregoing and various other omissions and additions may be made therein and thereto without departing from the spirit and scope of the present invention.

What is claimed is:

1. A power sharing system for amplifying a plurality of input signals, comprising:

a number, N, of amplification means;

where N is a power, r, of m as given by the relationship:

$$N=m^r$$

9

Fourier transform matrix means implemented using a radix-m decimation-in-frequency algorithm having r stages, said Fourier transform matrix being responsive to said plurality of input signals for providing transformed signals, each one of said transformed signals containing a portion, 1/N, of each one of said plurality of input signals, each one of said transformed signals being provided to a corresponding one of said amplification means for providing amplified transformed signals; and inverse-Fourier transform matrix means implemented using a radix-m decimation-in-time algorithm having r stages, said inverse-Fourier transform matrix being responsive to said amplified transformed signals for providing amplified input signals, each one of said amplified input signals corresponding to one of said plurality of said input signals.

2. A power sharing system according to claim 1, further comprising:

a plurality of radio channels for providing radio signals;

a number, N, of combiner means for combining radio signals, and for generating at combiner outputs said input signals indicative of said combined radio signals; and switching means for providing radio signals from each one of said radio channels to any one of said combiner means.

3. A power sharing system according to claim 2, wherein a radio signal from one of said radio channels is provided to only one of said combiner means at a time.

4. A power sharing system according to claim 2, further comprising:

a number, N, of antennas; and wherein said inverse-Fourier transform means provides each one of said amplified input signals to a corresponding one of said antennas.

5. A power sharing system according to claim 4, wherein:

each one of said combiner means corresponds to one of said antennas, and said switching means can dynamically connect a radio signal from any one of said radio channels to any one of said combiner means.

6. A power sharing system according to claim 2, wherein each one of said radio channels provides said radio signals at a unique frequency.

7. A power sharing system according to claim 1, wherein each one of said amplification means are phase balanced with respect to one another such that each one of said amplified transformed signals experiences an identical phase shift during amplification by said amplification means.

8. A power sharing system according to claim 1 wherein said Fourier transform matrix means is a Fast-Fourier transform matrix and,said inverse-Fourier transform matrix means is an inverse-Fast-Fourier transform matrix.

9. A land mobile radio system comprising:

a plurality of radio channels for providing radio signals;

a number, N, of combiner means for combining radio signals, and for generating combiner output signals indicative of said combined radio signals;

switching means for providing radio signals from each one of said radio channels to any one of said combiner means, a radio signal from one of said radio channels being provided to only one of said combiner means at a time;

a number, N, of amplification means;

10 transform matrix means responsive to said combiner output signals for providing transformed signals, each one of said transformed signals containing a portion, 1/N, of each one of said combiner output signals, each one of said transformed signals being provided to a corresponding one of said amplification means for providing amplified transformed signals;

a number, N, of antennas; and inverse-transform matrix means responsive to said amplified transformed signals for providing amplified combiner output signals, each one of said amplified combiner output signals corresponding to one of said combiner output signals, each one of said amplified combiner output signals being provided to a corresponding one of said antennas.

10. A land mobile radio system according to claim 9, wherein said transform matrix means is a Fourier transform matrix and said inverse-transform matrix means is an inverse-Fourier transform matrix.

11. A land mobile radio system according to claim 10 wherein:

N is a power, r, of m as given by the relationship $$N=m^r$$

said Fourier transform matrix is implemented using a radix-m decimation-in-frequency algorithm having r stages, and said inverse-Fourier transform matrix is implemented using a radix-m decimation-in-time algorithm having r stages.

12. A land mobile radio system according to claim 9 wherein:

N is a power, r, of m as given by the relationship $$N=m^r$$

said transform matrix means is a Fourier transform matrix using a radix-m decimation-in-frequency algorithm having r stages, and said inverse-transform matrix means is an inverse-Fourier transform matrix using a radix-m decimation-in-time algorithm having r stages.

13. A land mobile radio system according to claim 9, wherein:

each one of said combiner means corresponds to one of said antennas, and said switching means can dynamically connect a radio signal from any one of said radio channels to any one of said combiner means.

14. A land mobile radio system according to claim 12, wherein:

each one of said combiner means corresponds to one of said antennas, and said switching means can dynamically connect a radio signal from any one of said radio channels to any one of said combiner means.

15. A land mobile radio system according to claim 14, wherein each one of said amplification means are phase, balanced with respect to one another such that each one of said amplified transformed signals experiences an identical phase shift during amplification by said amplification means.

16. A land mobile radio system according to claim 15, wherein said amplification means are high power radio frequency (RF) amplifiers.

17. A power sharing system according to claim 9, wherein each one of said amplification means are phase balanced with respect to one another such that each one of said amplified transformed signals experiences an identical phase shift during amplification by said amplification means.

18. A land mobile radio system according to claim 14, wherein each one of said radio channels provides said radio signals at a unique frequency.

19. A land mobile radio system according to claim 9 wherein said transform matrix means is a Fast-Fourier transform matrix and said inverse-transform matrix means is an inverse-Fast-Fourier transform matrix.

20. A land mobile radio system according to claim 19 wherein:

N is a power, r, of m as given by the relationship $$N=m^r$$

said Fast-Fourier transform matrix is implemented using a radix-m decimation-in-frequency algorithm having r stages, and said inverse-Fast-Fourier transform matrix is implemented using a radix-m decimation-in-time algorithm having r stages.

21. A land mobile radio system according to claim 20, wherein:

each one of said combiner means corresponds to one of said antennas, and, said switching means can dynamically connect a radio signal from any one of said radio channels to any one of said combiner means.

22. A land mobile radio system according to claim 21, wherein each one of said amplification means are phase balanced with respect to one another such that each one of said amplified transformed signals experiences an identical phase shift during amplification by said amplification means.

23. A land mobile radio system according to claim 22, wherein said amplification means are high power radio frequency (RF) amplifiers.

24. A land mobile radio system according to claim 23, wherein each one of said radio channels provides said radio signals at a unique frequency.

25. A method for amplifying a plurality of input signals comprising the steps of:

providing a number, N, of amplification means where N is a power, r, of m as given by the relationship:

$$N=m^r$$

implementing a Fourier transform matrix means using a radix-m decimation-in-frequency algorithm having r stages, transforming said plurality of input signals into a plurality of transformed signals using said Fourier transform matrix means, each one of said transformed signals containing a portion, 1/N, of each one of said plurality of input signals;

implementing an inverse-Fourier transform matrix means using a radix-m decimation-in-time algorithm having r stages;

providing each one of said transformed signals to a corresponding one of said amplification means for providing amplified transformed signals; and inverse-transforming said amplified transformed signals into a plurality of amplified input signals using said inverse-Fourier transform matrix means, each one of said amplified input signals corresponding to one of said plurality of said input signals.

26. The method of claim 25, further comprising the steps of:

providing a plurality of radio signals;

grouping said radio signals into a plurality of groups; and combining said radio signals in each one of said groups, each one of said groups of combined radio signals being an input signal.

27. The method of claim 26, further comprising the steps of:

providing a number, N, of antennas; and wherein said inverse-Fourier transform means provides each one of said amplified input signals to a corresponding one of said antennas.

28. The method of claim 27, further comprising the step of dynamically assigning said radio signals to any one of said groups.

29. The method of claim 28, further comprising the step of phase balancing each one of said amplification means with respect to one another.

30. The method of claim 25, further comprising the step of phase balancing each one of said amplification means with respect to one another.

31. The method of claim 30, wherein said step of transforming is performed by a Fast-Fourier transform matrix and said step of inverse-transforming is performed by an inverse-Fast-Fourier transform matrix.

* * * * *

UNITED STATES PATENT AND TRADEMARK OFFICE
CERTIFICATE OF CORRECTION

PATENT NO. : 5,790,517
DATED : Aug. 4, 1998
INVENTOR(S) : Sheldon Kent Meredith

It is certified that error appears in the above-identified patent and that said Letters Patent is hereby corrected as shown below:

At title page of patent at Foreign Patent Documents add

--9623329      1/8/96      International--.

In column 10, line 16 "," should be deleted.

In column 11, line 30, "," should be deleted.

Signed and Sealed this

Nineteenth Day of January, 1999

Attest:

Attesting Officer

*Acting Commissioner of Patents and Trademarks*